US006423641B1

(12) United States Patent
Gau

(10) Patent No.: US 6,423,641 B1
(45) Date of Patent: Jul. 23, 2002

(54) METHOD OF MAKING SELF-ALIGNED BIT-LINES

(75) Inventor: Jing-Horng Gau, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 68 days.

(21) Appl. No.: 09/664,428

(22) Filed: Sep. 18, 2000

(51) Int. Cl.[7] ............................................. H01L 21/00
(52) U.S. Cl. ........................ 438/692; 438/745; 438/753; 438/756
(58) Field of Search ................................. 438/723, 743, 438/692, 719, 745, 756, 753; 216/2, 79, 67, 99

(56) References Cited

U.S. PATENT DOCUMENTS 6,159,833 A * 12/2000 Lee et al. ................ 438/723 X
6,235,639 B1 * 5/2001 Sandhu et al. ........... 438/734 X

* cited by examiner

Primary Examiner—William A. Powell
(74) Attorney, Agent, or Firm—Winston Hsu

(57) ABSTRACT

The present invention provides a method of making self-aligned bit-lines on a semiconductor wafer. The semiconductor wafer comprises a silicon substrate, a plurality of word-lines located on the silicon substrate and a first dielectric layer that covers each word-line. A plurality of bit-line contacts are formed that are level with the surface of the first dielectric layer. A second dielectric layer is formed on the surface of the semiconductor wafer and a plurality of node contacts are formed in the second and first dielectric layer, which are leveled with the surface of the second dielectric layer. Portions of the second dielectric layer are removed to make the top portion of each node contact higher than the surface of the second dielectric layer. A spacer is formed around this top portion of each node contact. Finally, the top portion of each node contact and the spacer are used as hard masks to form a plurality of bit-lines in the second and first dielectric layers, and a plurality of bit-line contacts contact with every bottom portion of the bit-line.

16 Claims, 9 Drawing Sheets

METHOD OF MAKING SELF-ALIGNED BIT-LINES

BACKGROUND OF THE INVENTION

1. Field of the Invention

The present invention relates to a method for making bit-lines on a semiconductor wafer, and more particularly, to a method for making self-aligned bit-lines.

2. Description of the Prior Art

Dynamic random access memory (DRAM) comprises an enormous amount of memory cells, each of which comprises a metal oxide semiconductor (MOS) and a capacitor. Each MOS and capacitor links with bit-lines through word lines to determine the location of each memory cell.

The design of a capacitor of a memory cell is based on two electric pole layers. The upper layer is a field plate and the lower layer is a storage node. The two layers are separated by a cell dielectric layer. When one electric pole layer is subjected to a voltage, an electric charge of the corresponding value is induced in the other electric pole layer. The data storing and retrieving functions are achieved in this way. The lower layer storage node, in the form of a node contact acting as a connecting line, connects electrically with the drain of a MOS transistor to store and retrieve data.

In order to raise the density of DRAM, when making lower layer storage nodes of the DRAM, landing pads are generally used in forming node contacts, which connect the MOS and capacitor with bit-lines. However, with advances in wafer production, the size of dynamic memory cells is being designed smaller and smaller. For this reason, the improvement and control of DRAM production processes has become an important subject in the field.

Please refer to FIGS. 1 to FIGS. 4. FIGS. 1 to 4 show the fabrication processes of a lower layer storage node 28 of a capacitor according to the prior art. As shown in FIG. 1, a semiconductor wafer 10 comprises a substrate 12, a landing pad 16 located on the substrate 12, a first dielectric layer 14 deposited on the surfaces of the substrate 12 and the landing pad 16, two bit-lines 18 located on the first dielectric layer 14 for data transmission, and a second dielectric layer 23 deposited over the surfaces of the two bit-lines 18 and the first dielectric layer 14. The two bit-lines are covered by a metallic silicide layer 20, which lowers the contact resistance of the surfaces of the bit-lines 18.

As shown in FIG. 2, according to the prior art method for making a node contact hole 26, a photoresist layer 24 on the surface of the second dielectric layer 23 is formed, and a lithographic process is used to pattern the location of the node contact hole 26 by forming a hole 25 in the photoresist layer 24. Next, an etching process is performed, using the photoresist layer 24 as a hard mask, to vertically remove the second dielectric layer 23 and then the first dielectric layer 16 along the hole 25 down to the surface of the landing pad 16. A node contact hole 26 is formed on the landing pad 16 between the two bit-lines 18.

As shown in FIG. 3, after removing the photoresist layer 24, a doped polysilicon layer (not shown) is deposited over the surface of the substrate 10, filling the node contact hole 26. An etching back process or a chemical mechanical polishing (CMP) process is then used to level the doped polysilicon layer in the node contact hole 26 with the second dielectric layer 23 to form a node contact 27.

Finally, as shown in FIG. 4, an amorphous silicon layer is evenly deposited over the surface of the substrate 10, and a photolithographic process and an etching process are used to form a lower layer storage node 28 on top of the node contact hole 26. A hemi-spherical grain (HSG) process is performed to increase the surface area of the lower layer storage node 28.

FIG. 5 shows a misalignment that can occur when making the lower layer storage node 28 of a capacitor according to the prior art. When etching the amorphous silicon layer to make the storage node 28, if the pattern of the location is not accurately transferred during the photolithographic process, a misalignment occurs. This misalignment allows the doped polysilicon layer in the node contact hole 26 (the node contact 27) to be etched off during the etching of the amorphous silicon layer. This results in a recess 29, which causes an insufficient thickness of the ONO layer over the doped polysilicon layer 27 in the recess 29 during later processes when forming a cell dielectric layer of oxide-nitride-oxide (ONO) over the storage node 28. This, in turn, results in a low-quality product. Additionally, since the node contact 27 is made after the two bit-lines 18, the line width of the bit-lines 18 must be made very narrow to avoid misalignment during the formation of the node contact hole 26. Unfortunately, the narrowing of the line width results in a high resistance in the bit-lines 18, which affects the transmission speed, and which may even interrupt data transmission in the bit-lines 18.

Moreover, as shown in FIGS. 1 to 4, the process for making the lower layer storage nodes 28 of the DRAM requires two photolithographic processes to define the location of the node contact hole 26 and the storage node 28. For this reason, a landing pad has to be made before hand, which increases the DRAM manufacturing costs. Furthermore, with the size of the substrate decreasing, the precision of the photolithographic pattern transfer is lowered, and the subsequent yield rate is thus lowered.

SUMMARY OF THE INVENTION

It is therefore a primary objective of the present invention to provide a method for making a self-aligned bit-line on a semiconductor wafer.

Another objective of the present invention is to prevent the problem of misalignment that occurs when making storage nodes on a semiconductor wafer.

In the preferred embodiment, the semiconductor wafer comprises a silicon substrate, a plurality of word lines located on the silicon substrate and a first dielectric layer located on the surface of the semiconductor wafer, which covers each word line. The manufacturing method of the present invention involves first forming a plurality of bit-line contacts, which are level with the surface of the first dielectric layer, in the first dielectric layer. Next, a second dielectric layer is formed on the surface of the semiconductor wafer and a plurality of node contacts are formed, which are level with the surface of the second dielectric layer, in the second and first dielectric layers. Thereafter, portions of the second dielectric layer are removed to make the top of each node contact higher than the surface of the second dielectric layer. A spacer is formed around the top of each node contact. The top of each node contact and spacer are used as a hard mask to form a plurality of word lines in the second and first dielectric layers. A plurality of bit-line contacts contact with the bottom portion of every bit-line. Finally, a storage node is formed on each node contact.

In the present invention, bit-lines are formed based on a difference in height, which is created through the etching process of conducting layers, and the conducting layer left in the lower region assumes the function of a landing pad, so the entire manufacturing process is simplified and costs are reduced.

DETAILED DESCRIPTION OF THE PRESENT INVENTION

Figure 1:
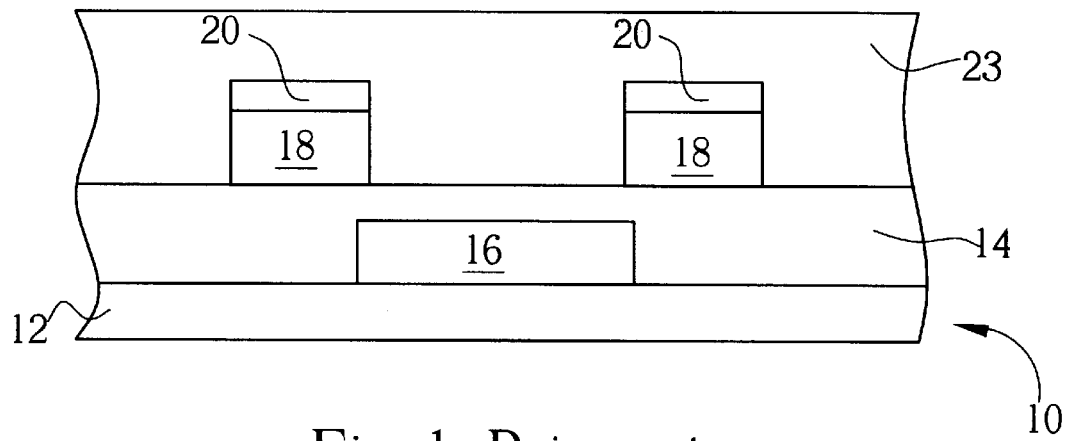
FIGS. 1 to 4 are process views for making a lower layer storage node of a capacitor according to the prior art.
Figure 2:
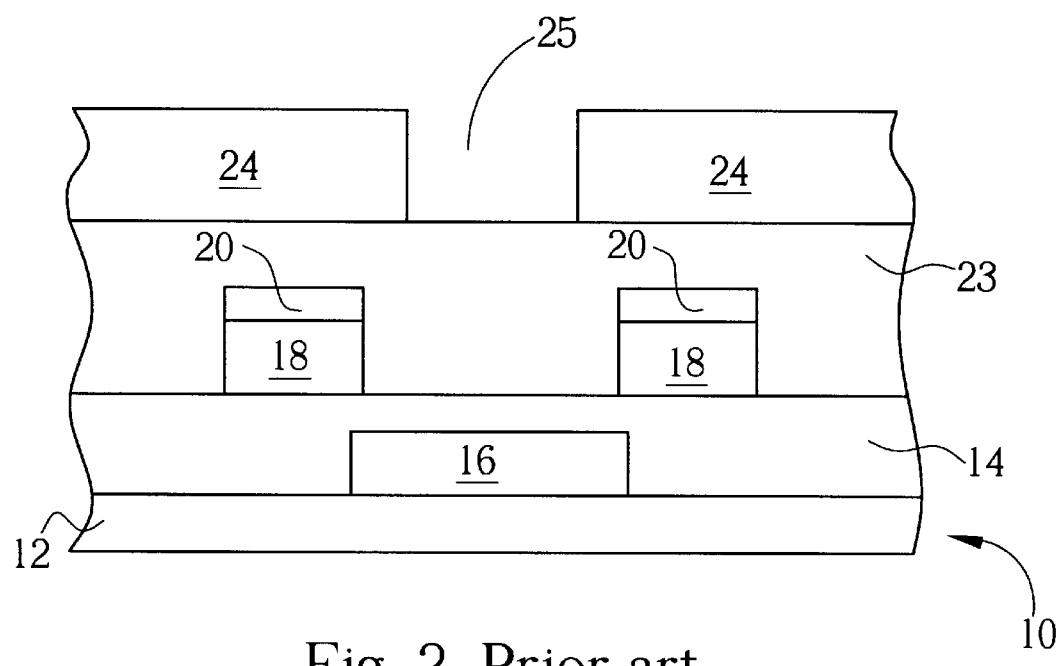
Figure 3:
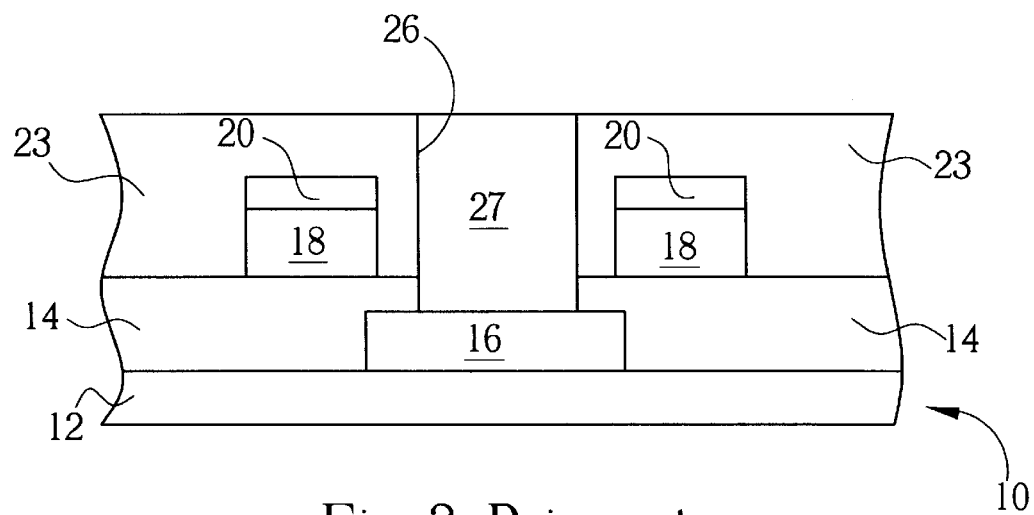
Figure 4:
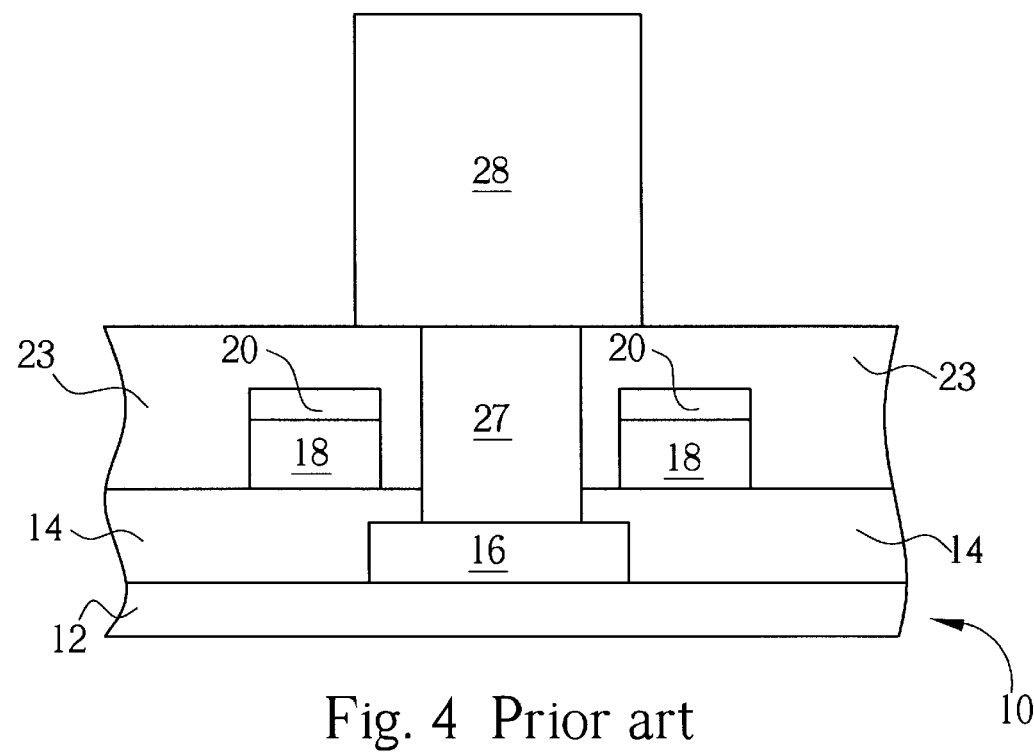
Figure 5:
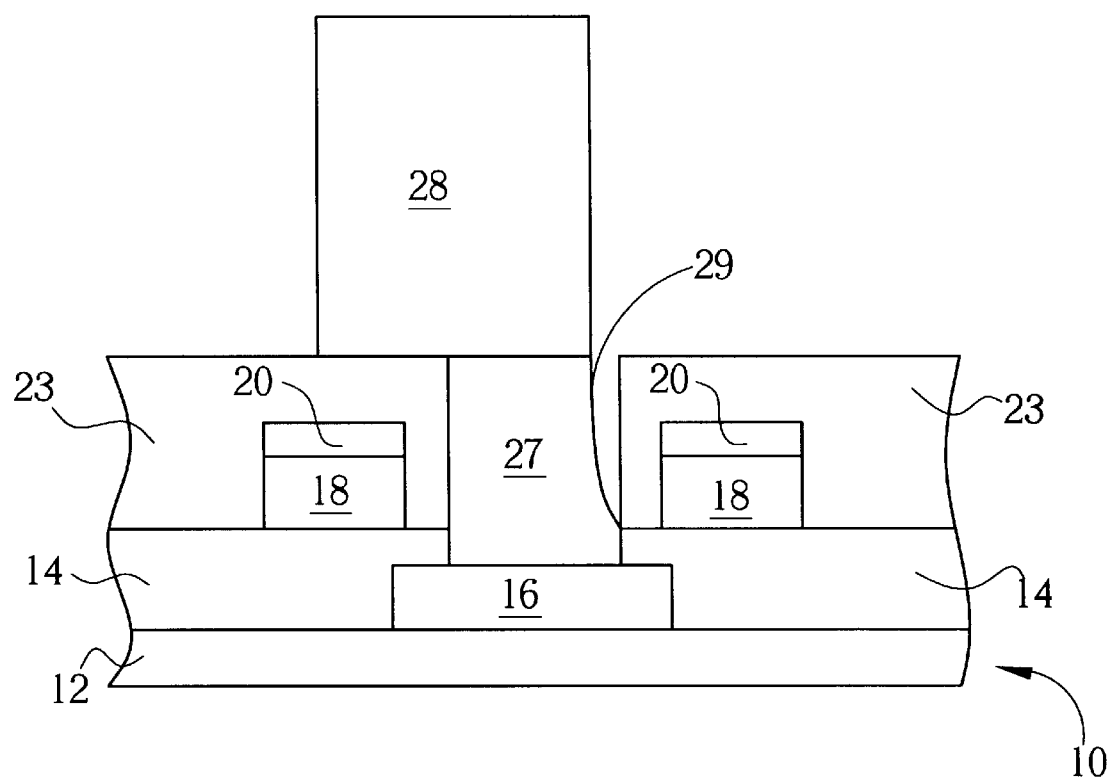
FIG. 5 is a view of misalignment that occurs when making a lower layer storage node of a capacitor according to the prior art.
Figure 6:
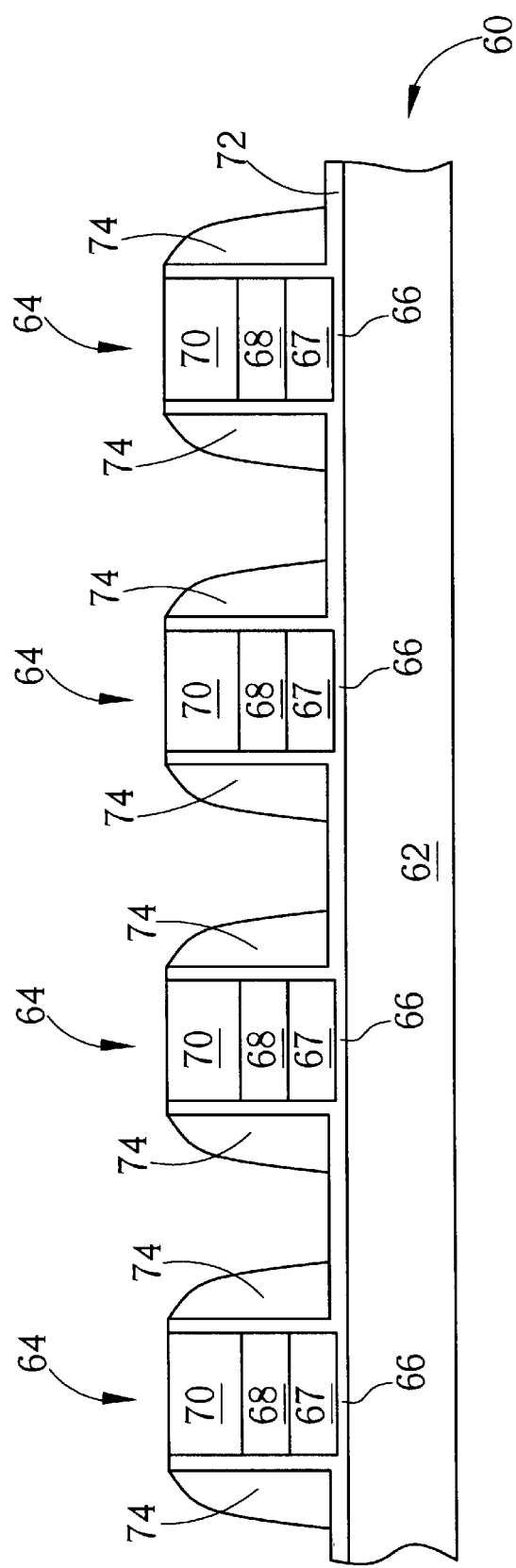
FIGS. 6 to 15 are views of the manufacturing processes of a bit-line and storage node according to the present invention.

Please refer to FIGS. 6 to 15. FIGS. 6 to 15 are cross-sectional diagrams of the manufacturing processes of a bit-line and storage node according to the present invention. As shown in FIG. 6, a semiconductor wafer 60 comprises a substrate 62, a plurality of word-lines 64 located on top of the substrate 62, and a plurality of MOS transistors (not shown), each of which is located in each word-line 64. Each word line 64 comprises a gate oxide layer 66, a doped polysilicon layer 67, a metallic silicide layer 68, and a cap layer 70. Along the walls of each word-line 64 are a liner oxide 72 and a spacer 74.

Figure 7:
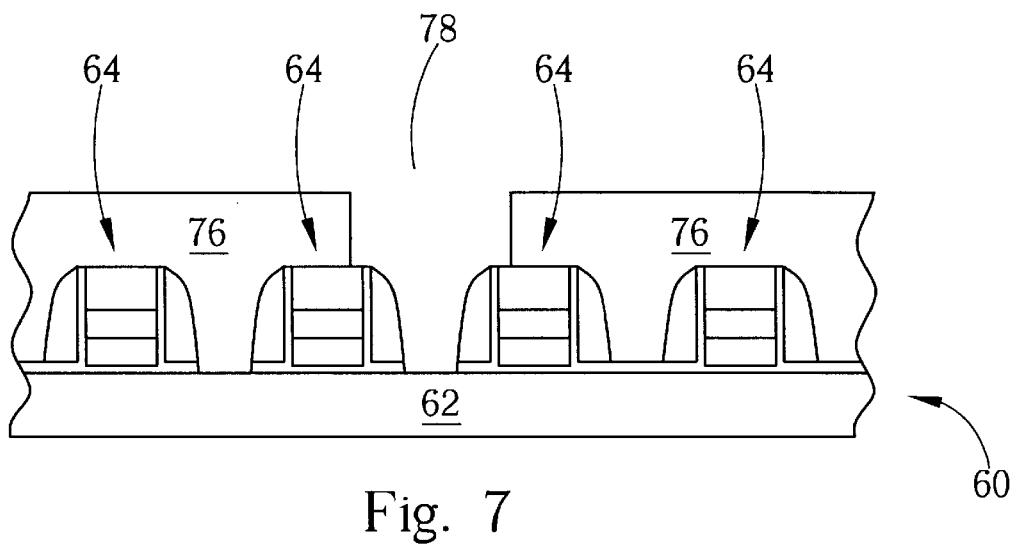

As shown in FIG. 7, the manufacturing process begins with a chemical vapor deposition (CVD) process. A first dielectric layer 76 of silicon oxide is uniformly deposited over the surface of the substrate 60. Next, a first photoresist layer (not shown) is coated on the first dielectric layer 76. A first lithographic process transfers the pattern of each node contact hole 80 and bit-line contact hole 78 to the first photoresist layer. Next, using the first photoresist layer, the cap layer 70 and the spacer 74 as hard masks, an etching process is performed, which etches out each contact hole 80 and bit-line contact hole 78 in the first dielectric layer 76, until reaching the surface of the substrate 62.

Figure 8:
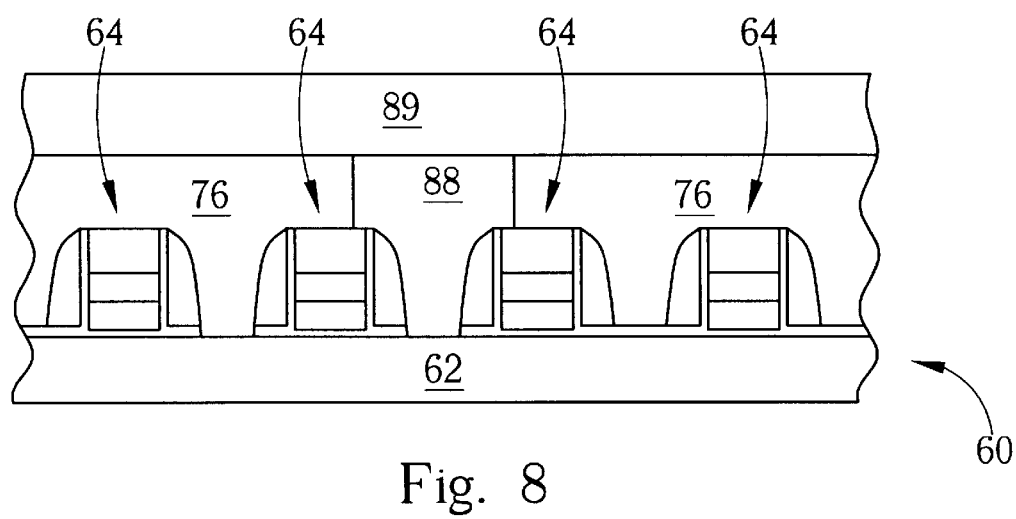

As shown in FIG. 8, after removing the first photoresist layer, a doped polysilicon layer is deposited onto the surface of the semiconductor wafer 60 to serve as the first conducting layer. The first conducting layer fills each bit-line contact hole 78. Then a planarization process, such as a CMP process or an etching back process, is performed so as to form a bit-line contact 88 in the bit-line contact hole 78, and the top surface of the bit-line contact 88 is leveled with the surface of the first dielectric layer 76. After that, a CVD process is used to uniformly deposit a second dielectric layer 89 composed of silicon oxide on the surface of the semiconductor wafer 60.

Figure 9:
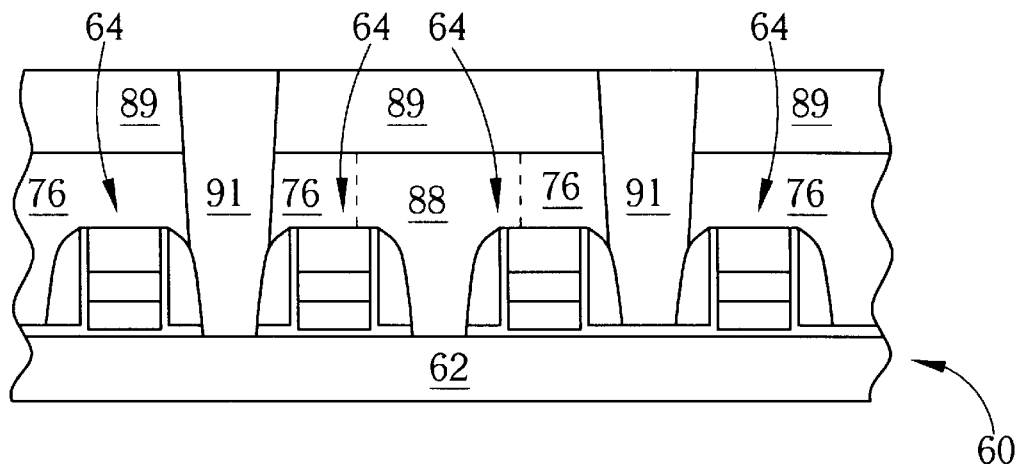

As shown in FIG. 9, a second photoresist layer (not shown) is coated over the second dielectric layer 89 and a second lithographic process is used to define the patterns of each node contact hole in the second photoresist layer. Then the second photoresist layer, the cap layer 70 and the spacer 74 are used as hard masks in an etching process, which etches out each node contact hole in the second dielectric layer 89 and the first dielectric layer 76, until reaching the surface of the substrate 62. The second photoresist layer is then removed and a doped polysilicon layer (not shown) is formed on the surface of the semiconductor wafer 60, which serves as a second conducting layer to fill each node contact hole. Next, a planarization process, such as a CMP process or an etching back process, is performed to form a node contact 91 in each node contact hole, the top surface of each node contact 91 level with the surface of the second dielectric layer. A metallic silicide layer (not shown) can be formed on the surface of each bit-line contact 88 and node contact 91 mentioned above so as to reduce the contact resistance of each bit-line contact 88 and node contact 91.

Figure 10:
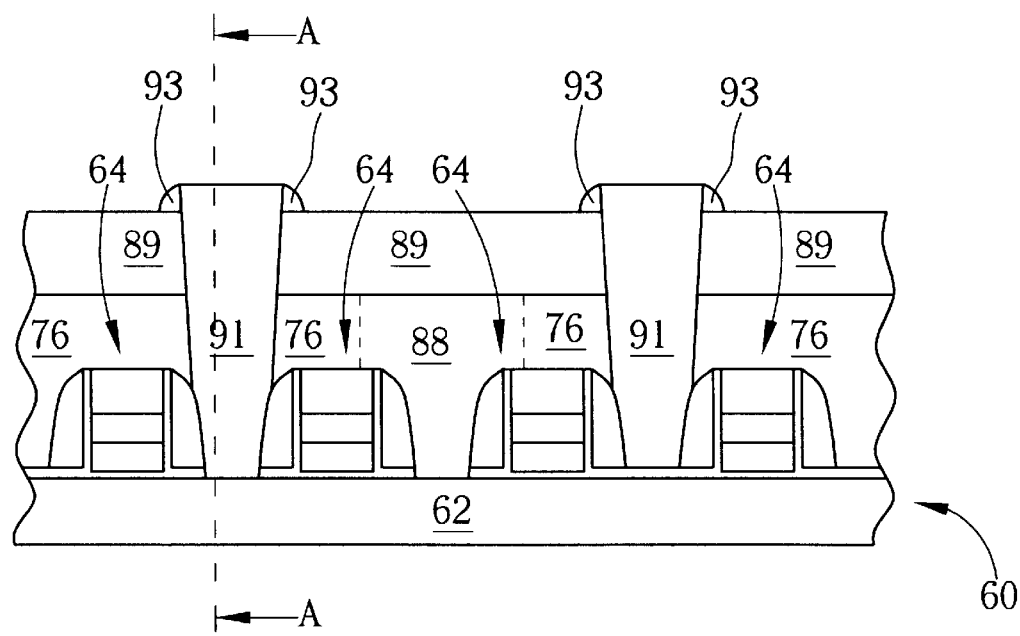

As shown in FIG. 10, an etching back process is performed to vertically remove portions of the second dielectric layer 89 on the surface of the semiconductor wafer 60, making the top of each node contact 91 higher than the surface of the second dielectric layer 89. A silicon nitride layer (not shown) is deposited over the semiconductor wafer 60. Next, an etching back process is used form a spacer 93 on the exposed walls around the top portion of each node contact 91.

Next, the top portion of each node contact 91 and the spacer 93 around it serve as hard masks to perform an etching processes of each bit line so as to prevent the misalignment of the bit lines. FIGS. 6 to 9 are rotated horizontally by 90 degrees to give better views of the following manufacturing process, which is shown in FIGS. 11 to 14.

Figure 11:
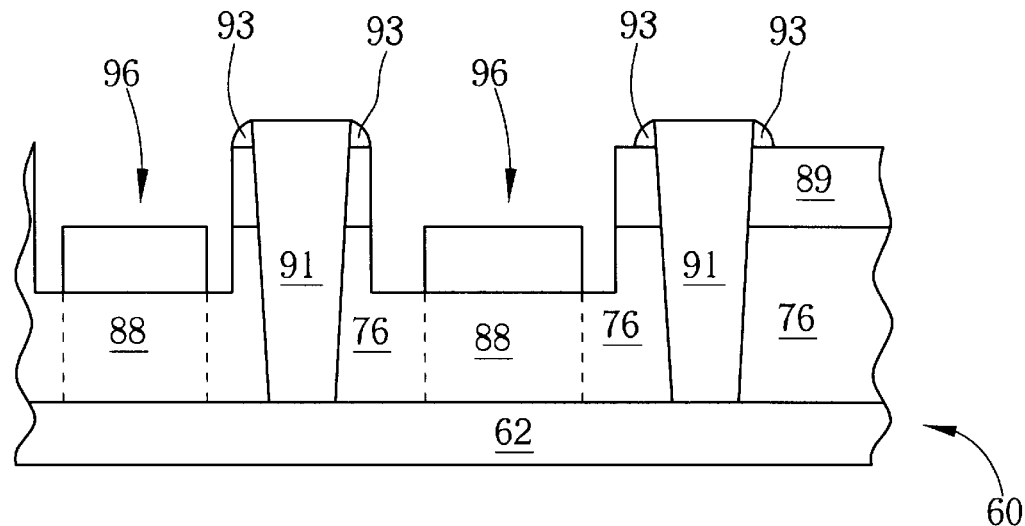

Thereafter, as shown in FIG. 11, a third photoresist layer (not shown) is formed on the surface of the semiconductor wafer 60. A third lithographic process is performed to define the pattern of each bit-line in the third photoresist layer. The pattern of the third photoresist layer is used as a hard mask to vertically etch down the second dielectric layer 89 and the first dielectric layer 76, so as to form a bit-line trench 96 in the first dielectric layer 76 and the second dielectric layer 89. A plurality of bit-line contacts 88 protrude from the bottom portion of each bit-line trench 96.

Figure 12:
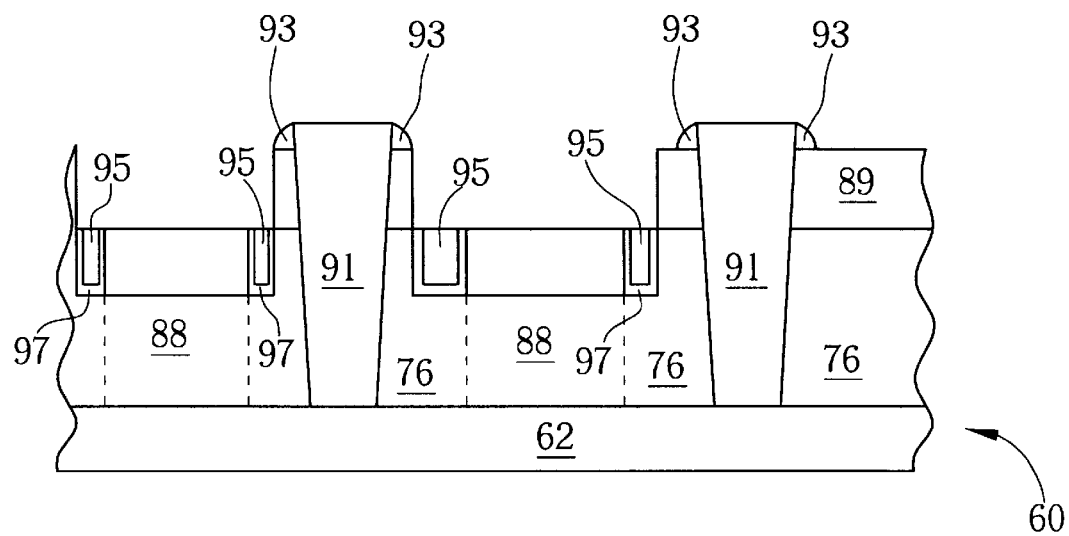

As shown in FIG. 12, after removing the third photoresist layer, a barrier layer 97 composed of titanium nitride or TiW and a tungsten layer 95 are formed on the surface of the semiconductor wafer 60 in order and serve as a third conducting layer. Then an etching back process is performed to remove portions of the barrier layer 97 and the tungsten layer 95 so as to level the surface of the remaining barrier layer 97 and tungsten layer 95 with the top of each bit-line contact 88, and bit-lines are formed. The barrier layer 97 of TiN or TiW also serves as a glue layer to increase the cohesion between the tungsten layer 95 and the dielectric layer or other materials. The third conducting layer can also be composed of doped polysilicon, metallic silicon or metals, such as aluminum and copper.

Figure 13:
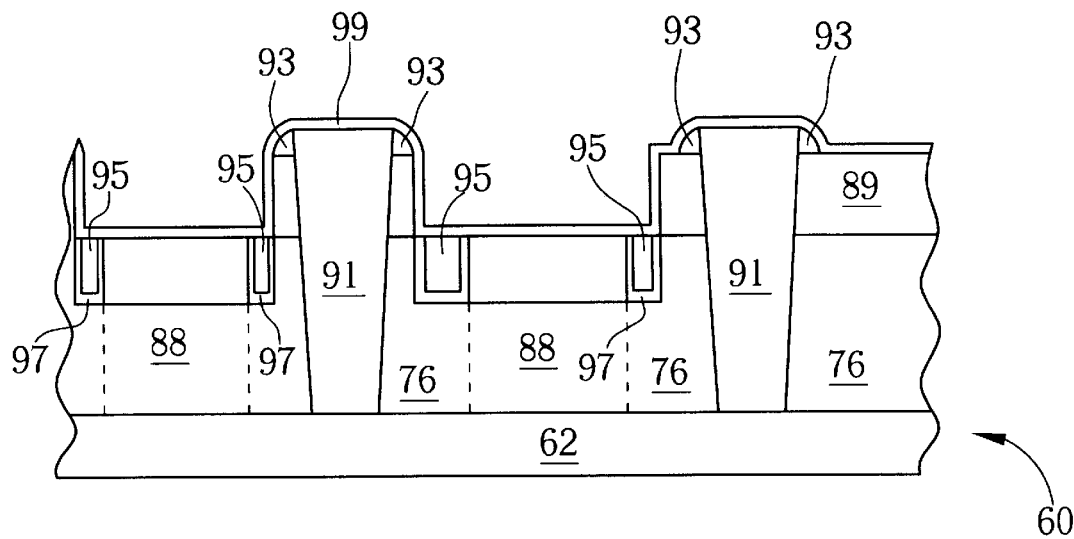
Figure 14:
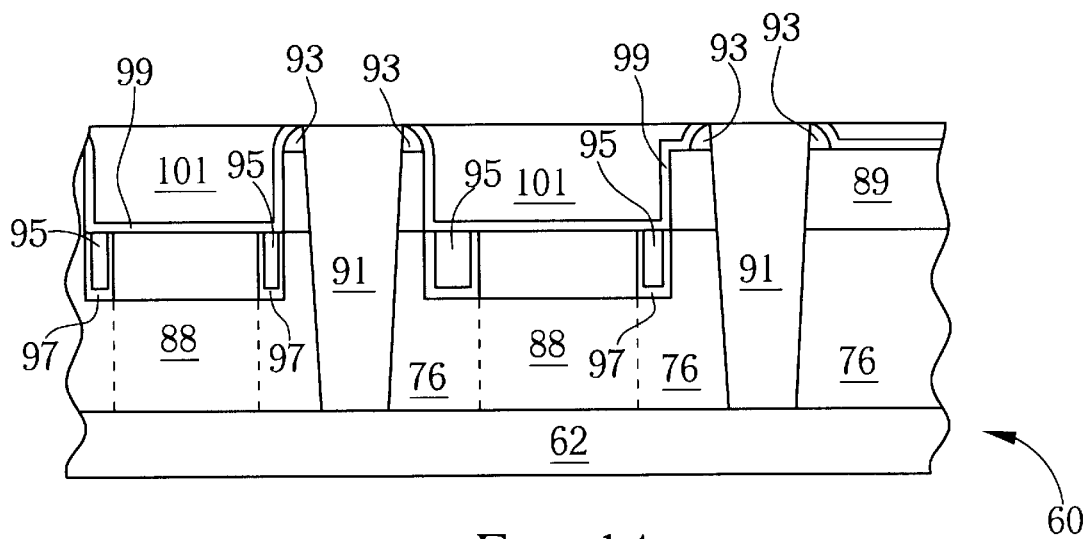
Figure 15:
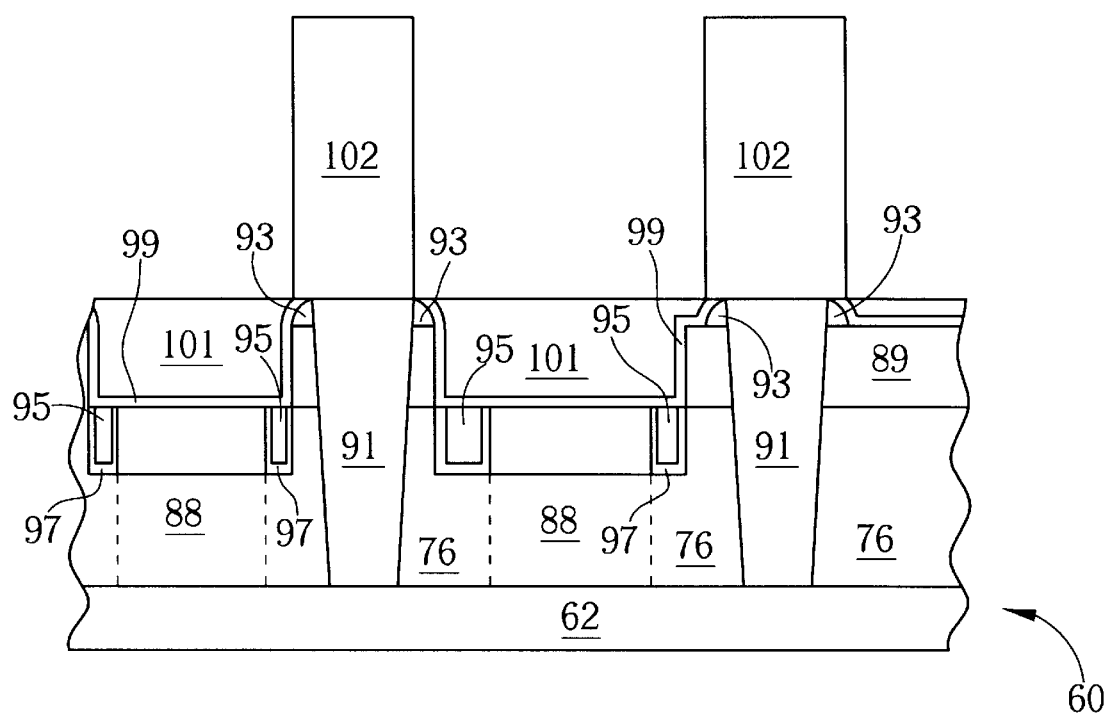

As shown in FIG. 13, a silicon nitride layer 99 is formed on the surface of the semiconductor wafer 60 to prevent short-circuiting of both storage nodes formed in later processes and the bit-lines. Next, as shown in FIG. 14, a third dielectric layer 101 composed of silicon oxide is evenly deposited over the semiconductor wafer 60 and fills each bit-line trench 96. A planarization process is used to remove portions of the third electric layer 101 and the silicon nitride layer 99 to level the surface of the third dielectric layer 101 on the semiconductor wafer 60 with the top portion of each node contact 91.

Finally, as shown in FIG. 13, a forth conducting layer (not shown) composed of amorphous silicon or doped polysilicon is formed over the surface of the semiconductor wafer 60. A forth photoresist layer (not shown) is then formed on the forth conducting layer. A forth lithographic process transfers the patterns of each storage node to the forth photoresist layer. Next, using the forth photoresist layer as a hard mask, the forth conducting layer is etched down to the third dielectric layer 101, forming storage nodes 102 above the node contacts 91.

Since the present method utilizes a borderless contact structure to shorten the distances between the node contact holes 82 and the word-lines 64, the surface area of the semiconductor wafer is efficiently used, and the problem of misalignment is avoided. Additionally, the spacer 93 formed around the node contact 91 acts as hard mask in the later etching process for the trench 96, thus avoiding the problem of misalignment during a photolithographic process.

Moreover, in the etching process for the storage node 102, a metallic silicide layer on top of the node contact 91 can be formed to serve as a protective layer in the photolithographic process, increasing the etching precision and avoiding photolithographic misalignment. The problem of recess formation in the doped polysilicon layer in the top of the node contact hole 91 during the etching process of the forth conducting layer is further avoided.

In comparison to the prior art, the present invention not only avoids misalignment, which is caused by the imprecision of the pattern transfer in a photolithographic process, but also uses the top portion of the node contact 91 and the spacer 93 formed around the node contact 91 to self-align each bit-line or to expand its line-width, reducing resistance and increasing transmission speeds. Additionally, the present method simplifies the manufacturing process for bit-lines and storage nodes, increases the misalignment tolerance in each etching process, and increases the efficiency of the semiconductor wafer manufacturing process.

The above disclosure is based on the preferred embodiment of the present invention. Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method for making self-aligned bit lines on a semiconductor wafer, the semiconductor wafer comprising a silicon substrate, a plurality of word lines positioned on the silicon substrate and a first dielectric layer positioned on the surface of the semiconductor wafer, the first dielectric layer covering each word line, the method comprising:

performing a first etching process so as to form a plurality of bit-line contact holes in the first dielectric layer;

forming a first conducting layer that fills the bit-line contact holes to form bit-line contacts, and leveling the top surface of each bit-line contact with the surface of the first dielectric layer;

forming a second dielectric layer on the surface of the semiconductor wafer;

performing a second etching process so as to form a plurality of node contact holes in the second and first dielectric layers;

forming a second conducting layer that fills the node contact holes to form node contacts, and leveling the top surface of each node contact with the surface of the second dielectric layer;

performing an etching back process to remove portions of the second dielectric layer so as to make the top surface of each node contact higher than the surface of the second dielectric layer;

forming a first spacer on the walls around the top portion of each node contact that is higher than the surface of the second dielectric layer;

performing a third etching process so as to form a plurality of bit-line trenches in the second and first dielectric layers, a plurality of bit-line contacts protruding from the bottom portion of each bit-line trench;

forming a third conducting layer that fills each bit-line trench to form each bit line, and leveling the top surface of each bit line with the top surface of each bit-line contact; and forming a third dielectric layer on the surface of the semiconductor wafer, the third dielectric layer filling each bit-line trench.

2. The method of claim 1 wherein the first and second conducting layers are composed of doped polysilicon.

3. The method of claim 2 wherein the first and second conducting layers both have a first metallic silicide layer over the doped polysilicon layer.

4. The method of claim 1 wherein the first spacer is composed of silicon nitride.

5. The method of claim 1 wherein the third dielectric layer is formed from a silicon oxide layer stacked on a silicon nitride layer.

6. The method of claim 5 wherein after the third dielectric layer is formed, the method includes:

performing a planarization process to remove portions of the silicon oxide layer and the silicon nitride layer so as to level the surface of the remaining portions of the third dielectric layer with the second conducting layer on each node contact; and forming a storage node on each node contact.

7. The method of claim 1 wherein the third conducting layer is comprised of doped polysilicon, metallic silicide, or metal.

8. The method of claim 1 wherein each word line comprises a gate oxide layer, a doped polysilicon layer, a second metallic silicide layer, and a protection layer on the top surface of each word line, and a second spacer is formed on walls of each word line.

9. A method for making bit lines and storage nodes on a semiconductor wafer, the semiconductor wafer comprising a silicon substrate, a plurality of word lines positioned on the silicon substrate, and a first dielectric layer positioned on the surface of the semiconductor wafer, the first dielectric layer covering each word line, the method comprising:

performing a first etching process so as to form a plurality of bit-line contact holes in the first dielectric layer;

forming a first conducting layer that fills the bit-line contact holes to form bit-line contacts, and leveling the top surface of each bit-line contact with the surface of the first dielectric layer;

forming a second dielectric layer on the surface of the semiconductor wafer;

performing a second etching process so as to form a plurality of node contact holes in the second and first dielectric layers;

forming a second conducting layer that fills the node contact holes to form node contacts, and leveling the top surface of each node contact with the surface of the second dielectric layer;

performing an etching back process to remove portions of the second dielectric layer so as to make the top portion of each node contact higher than the surface of the second dielectric layer;

forming a first spacer on the walls around the top portions of each node contact that are higher than the surface of the second dielectric layer;

performing a third etching process so as to form a plurality of bit-line trenches in the second and first dielectric layers, a plurality of bit-line contacts protruding from the bottom portion of each bit-line trench;

forming a third conducting layer that fills each bit-line trench to form bit lines, and leveling the top surface of each bit line with the top surface of each bit-line contact;

forming a third dielectric layer on the surface of the semiconductor wafer that fills each bit-line trench;

forming a forth conducting layer on the surface of the third dielectric layer; forming a photoresist layer on the surface of the forth conducting layer;

performing a photolithographic process to define storage node patterns in the photoresist layer; and using the patterns in the photoresist layer as a hard mask to etch the forth conducting layer down to the surface of the third dielectric layer so as to form storage nodes on each node contact.

10. The method of claim 9 wherein the first and second conducting layers are composed of doped polysilicon.

11. The method of claim 10 wherein the first and the second conducting layers both have a first metallic silicide layer over the doped polysilicon layer.

12. The method of claim 9 wherein the first spacer is composed of silicon nitride.

13. The method of claim 9 wherein the third dielectric layer is formed from a silicon oxide layer stacked on a silicon nitride layer.

14. The method of claim 13 wherein after the third dielectric layer is formed, the method includes an etching back process to remove portions of the silicon oxide layer and the silicon nitride layer so as to level the surface of the remaining portions of the third dielectric layer with the second conducting layer on each node contact.

15. The method of claim 9 wherein the third conducting layer is composed of doped polysilicon, metallic silicide, or metal.

16. The method of claim 9 wherein each word line comprises a gate oxide layer, a doped polysilicon layer, a second metallic silicide layer, and a protection layer on the top surface of each word line, and a second spacer is formed on the walls of each word line.

* * * * *